United States Patent
Lubomirsky et al.

(10) Patent No.: US 7,323,058 B2
(45) Date of Patent: Jan. 29, 2008

(54) APPARATUS FOR ELECTROLESS DEPOSITION OF METALS ONTO SEMICONDUCTOR SUBSTRATES

(75) Inventors: Dmitry Lubomirsky, Cupertino, CA (US); Arulkumar Shanmugasundram, Sunnyvale, CA (US); Russell Ellwanger, San Juan Bautista, CA (US); Ian A. Pancham, San Francisco, CA (US); Ramakrishna Cheboli, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/996,342

(22) Filed: Nov. 22, 2004

(65) Prior Publication Data

US 2005/0160990 A1 Jul. 28, 2005

Related U.S. Application Data

(60) Provisional application No. 60/539,491, filed on Jan. 26, 2004.

(51) Int. Cl.
*B05C 3/02* (2006.01)
(52) U.S. Cl. .............. 118/410; 118/423; 118/428; 118/429; 118/321; 204/227; 204/232; 204/242; 204/267; 134/902
(58) Field of Classification Search ............... 204/227, 204/232, 242, 275.1, 267, 269; 134/902; 118/410, 423, 428, 429, 321, 323, 500
See application file for complete search history.

(56) References Cited

U.S. PATENT DOCUMENTS

| 4,432,635 | A | 2/1984 | Mayer et al. |
| 4,758,926 | A | 7/1988 | Herrell et al. |
| 5,622,593 | A | 4/1997 | Arasawa et al. |
| 5,720,818 | A | 2/1998 | Donde et al. |
| 5,801,442 | A | 9/1998 | Hamilton et al. |
| 5,824,599 | A | 10/1998 | Schacham-Diamond et al. |
| 5,966,940 | A | 10/1999 | Gower et al. |
| 5,998,240 | A | 12/1999 | Hamilton et al. |
| 6,066,575 | A | 5/2000 | Reardon et al. |
| 6,154,369 | A | 11/2000 | Martinez, Jr. et al. |
| 6,177,661 | B1 | 1/2001 | Lee et al. |
| 6,258,223 | B1* | 7/2001 | Cheung et al. ............. 204/242 |
| 6,267,853 | B1* | 7/2001 | Dordi et al. ................ 204/232 |
| 6,444,027 | B1* | 9/2002 | Yang et al. ................. 117/200 |
| 6,463,938 | B2 | 10/2002 | Bran |
| 6,465,765 | B2 | 10/2002 | Katayama et al. |

(Continued)

FOREIGN PATENT DOCUMENTS

EP 1 209 251 A 5/2002

(Continued)

*Primary Examiner*—Laura Edwards
(74) *Attorney, Agent, or Firm*—Patterson & Sheridan, LLP

(57) ABSTRACT

An electroless deposition system is provided. The system includes a processing mainframe, at least one substrate cleaning station positioned on the mainframe, and an electroless deposition station positioned on the mainframe. The electroless deposition station includes an environmentally controlled processing enclosure, a first processing station configured to clean and activate a surface of a substrate, a second processing station configured to electrolessly deposit a layer onto the surface of the substrate, and a substrate transfer shuttle positioned to transfer substrates between the first and second processing stations. The system also includes a substrate transfer robot positioned on the mainframe and configured to access an interior of the processing enclosure.

25 Claims, 7 Drawing Sheets

U.S. PATENT DOCUMENTS

| | | |
|---|---|---|
| 6,666,949 B1 | 12/2003 | Hillman et al. |
| 6,921,466 B2 * | 7/2005 | Hongo et al. ............... 204/198 |
| 2002/0083960 A1 | 7/2002 | Wirth et al. |
| 2002/0096114 A1 | 7/2002 | Carducci et al. |
| 2003/0181040 A1 | 9/2003 | Ivanov et al. |
| 2004/0052963 A1 | 3/2004 | Ivanov et al. |
| 2004/0084143 A1 | 5/2004 | Ivanov et al. |
| 2004/0094186 A1 | 5/2004 | Ivanov |
| 2004/0097071 A1 | 5/2004 | Ivanov |
| 2004/0154535 A1 | 8/2004 | Chen et al. |
| 2005/0072525 A1 | 4/2005 | Pancham et al. |

FOREIGN PATENT DOCUMENTS

| | | |
|---|---|---|
| WO | WO 2005/038094 | 4/2005 |

* cited by examiner

US 7,323,058 B2

APPARATUS FOR ELECTROLESS DEPOSITION OF METALS ONTO SEMICONDUCTOR SUBSTRATES

CROSS-REFERENCE TO RELATED APPLICATIONS

This application claims benefit of U.S. Provisional Patent Application Ser. No. 60/539,491, titled "Apparatus for Electroless Deposition of Metals onto Semiconductor Wafers," filed Jan. 26, 2004, which is incorporated herein by reference.

BACKGROUND OF THE INVENTION

1. Field of the Invention

Embodiments of the invention generally relate to an electroless deposition system for semiconductor processing.

2. Description of the Related Art

Metallization of sub 100 nanometer sized features is a foundational technology for present and future generations of integrated circuit manufacturing processes. More particularly, in devices such as ultra large scale integration-type devices, i.e., devices having integrated circuits with several million logic gates, the multilevel interconnects that lie at the heart of these devices are generally formed by filling high aspect ratio, i.e., greater than about 25:1, interconnect features with a conductive material, such as copper. At these dimensions, conventional deposition techniques, such as chemical vapor deposition and physical vapor deposition, are not able to reliably fill interconnect features. As a result, plating techniques, i.e., electrochemical plating and electroless plating, have emerged as promising processes for void free filling of sub 100 nanometer sized high aspect ratio interconnect features in integrated circuit manufacturing processes. Additionally, electrochemical and electroless plating processes have also emerged as promising processes for depositing post deposition layers, such as capping layers.

However, with regard to electroless plating processes, conventional electroless processing systems and methods have faced several challenges, such as accurately controlling the deposition process and the defect ratios in the resulting deposition layers. More particularly, conventional systems have suffered from poor substrate temperature control, as the resistive heaters and heat lamps used on conventional electroless cells have not had the ability to provide a uniform temperature across the surface of the substrate, which is critical to the uniformity of electroless deposition processes. Additionally, conventional electroless systems have not implemented control over the environment inside the electroless deposition chamber, which has recently been shown to have a substantial impact on defect ratios. Further, a functional and efficient integrated platform for electroless deposition processes capable of depositing uniform layers with minimal defects has not been developed. As such, there is a need for an integrated electroless deposition apparatus capable of depositing uniform layers having minimal defects.

SUMMARY OF THE INVENTION

Embodiments of the invention provide an electroless deposition system. The system includes a processing mainframe, at least one substrate cleaning station positioned on the mainframe, and at least one electroless deposition station positioned on the mainframe. The electroless deposition station includes an environmentally controlled processing enclosure, a first processing station configured to clean and activate a surface of a substrate, a second processing station configured to electrolessly deposit a layer onto the surface of the substrate, and a substrate transfer shuttle positioned to transfer substrates between the first and second processing stations. The system also includes a substrate transfer robot positioned on the mainframe and configured to access an interior of the processing enclosure.

Embodiments of the invention also provide an electroless deposition system configured to efficiently deposit conductive layers onto semiconductor substrates with minimal defects. The system includes an electroless deposition enclosure positioned on a processing mainframe. The deposition enclosure interior environment is pressure and temperature controlled and includes a first and a second substrate processing station. The first substrate processing station is configured to clean and activate a substrate, while the second substrate processing station is configured to electrolessly deposit a layer onto the substrate. A substrate shuttle is positioned in the enclosure and is configured to transport substrates between the respective stations.

Embodiments of the invention further provide a deposition system for semiconductor processing. An embodiment of the deposition system generally includes a processing enclosure defining an environmentally controlled processing volume, a first fluid processing cell positioned in the processing volume, a second fluid processing cell positioned in the processing volume, and a substrate shuttle positioned in the processing volume and configured to pivotally transfer a substrate between the first and second fluid processing cells. The first and second fluid processing cells generally include a fluid diffusion member, a substrate support assembly configured to support a substrate in parallel relationship with the fluid diffusion member, and a fluid dispensing arm movably positioned to dispense a processing fluid onto the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of the inventions and are therefore not to be considered limiting of its scope, for the inventions may admit to other equally effective embodiments.

DETAILED DESCRIPTION OF THE PREFERRED EMBODIMENT

Figure 1:
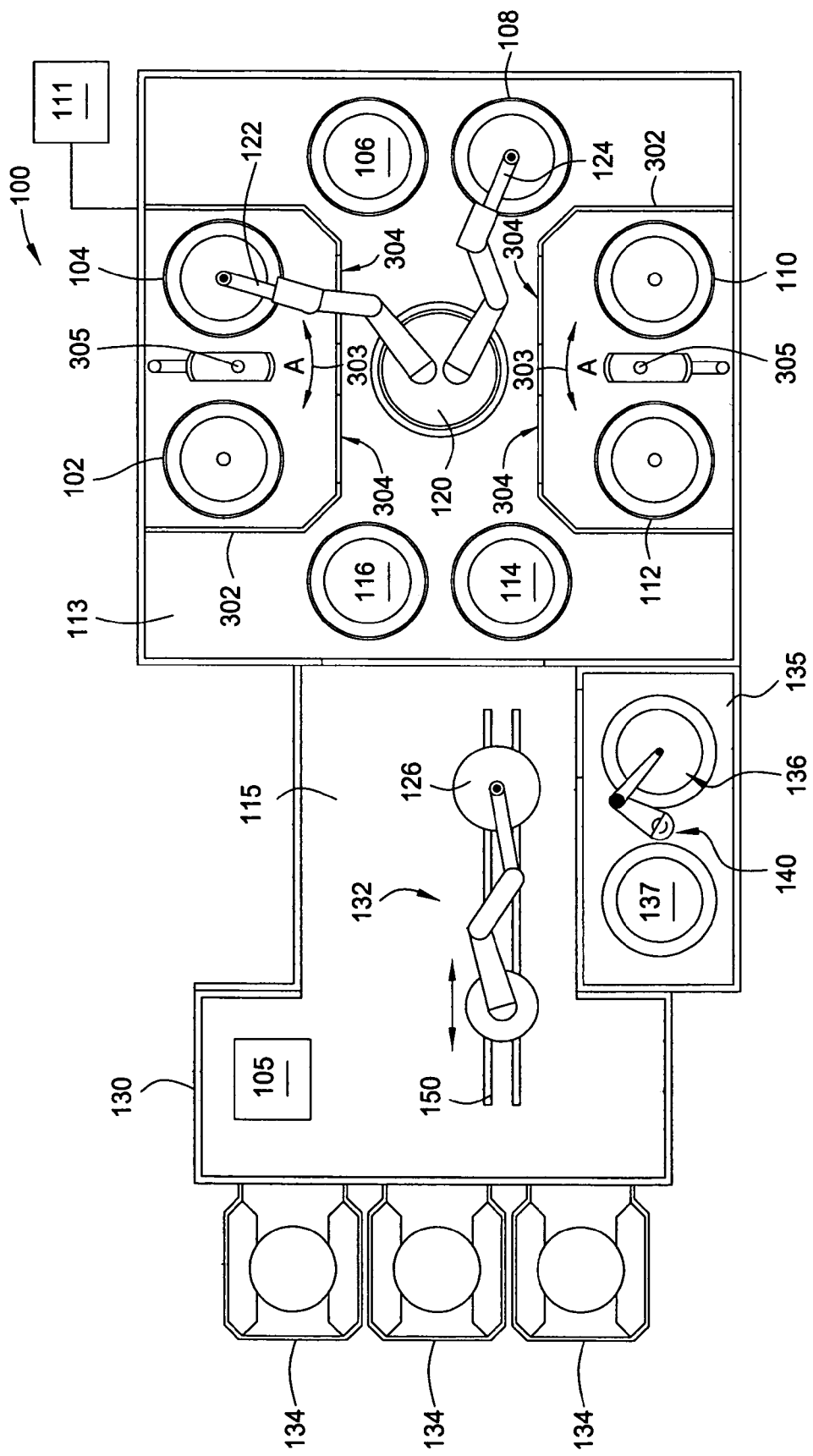
FIG. 1 is a plan view of an exemplary electroless plating.

FIG. 1 illustrates an embodiment of an electroless deposition system 100. System 100 includes a factory interface 130 that includes a plurality of substrate loading stations 134 configured to interface with substrate containing cassettes. A factory interface robot 132 is positioned in the factory interface 130 and is configured to access and transfer substrates 126 into and out of the cassettes positioned on the loading stations 134. The robot 132 also extends into a link tunnel 115 that connects the factory interface 130 to a processing mainframe 113. The position of robot 132 allows for access to loading stations 134 to retrieve substrates therefrom, and to then deliver the substrates 126 to one of the processing cell locations 114, 116 positioned on the mainframe 113, or alternatively, to the annealing station 135. Similarly, robot 132 may be used to retrieve a substrate 126 from the processing cell locations 114, 116 or the annealing station 135 after a substrate processing sequence is complete. In this situation robot 132 may deliver the substrate 126 back to one of the cassettes positioned on the loading stations 134 for removal from system 100.

The factory interface 130 may also include a metrology inspection station 105, which may be used to inspect substrates before and/or after processing in system 100. The metrology inspection station 105 may be used, for example, to analyze the characteristics, e.g., thickness, planarity, grain structure, topography, etc., of materials deposited on the substrate. Exemplary metrology inspection stations that may be used in embodiments of the invention include the BX-30 Advanced Interconnect Measurement System, and CD-SEM or DR-SEM inspection stations, all of which are commercially available from Applied Materials, Inc. of Santa Clara, Calif. An exemplary metrology inspection station is also illustrated in commonly assigned U.S. Patent Application Ser. No. 60/513,310, filed on Oct. 21, 2003, entitled "Plating System with Integrated Substrate Inspection", which is hereby incorporated by reference in its entirety to the extent not inconsistent with the present invention.

The annealing station 135 generally includes a two position annealing station, wherein a cooling plate 136 and a heating plate 137 are positioned adjacent each other with a substrate transfer robot 140 positioned proximate thereto, e.g., between the two stations. The substrate transfer robot 140 is generally configured to move substrates between the heating plate 137 and the cooling plate 136. System 100 may include a plurality of annealing stations 135, wherein the stations 135 may be in a stacked configuration. Further, although the annealing chamber 135 is illustrated as being positioned such that it is accessed from the link tunnel 115, embodiments of the invention are not limited to any particular configuration or placement of the annealing station 135. As such, the anneal station 135 may be positioned in direct communication with the mainframe 113, i.e., accessed by mainframe robot 120, or alternatively, the annealing station 135 may be positioned in communication with the mainframe 113, i.e., the annealing station may be positioned on the same system as mainframe 113, but may not be in direct contact with the mainframe 113 or accessible from the mainframe robot 120. For example, as illustrated in FIG. 1, the anneal station 135 may be positioned in direct communication with the link tunnel 115, which allows for access to mainframe 113 via robots 132 and/or 120. Additional description of the anneal chamber 135 and the operation thereof may be found in commonly assigned U.S. patent application Ser. No. 10/823,849, entitled "Two Position Anneal Chamber," filed on Apr. 13, 2004, which is hereby incorporated by reference in its entirety to the extent not inconsistent with the present invention.

Processing mainframe 113 includes a centrally positioned mainframe substrate transfer robot 120. Mainframe robot 120 generally includes one or more blades 122, 124 configured to support and transfer substrates. Additionally, mainframe robot 120 and the accompanying blades 122, 124 are generally configured to independently extend, rotate, pivot, and vertically move so that the mainframe robot 120 may simultaneously insert and remove substrates to/from the plurality of processing cell locations 102, 104, 106, 108, 110, 112, 114, 116 positioned on mainframe 113. Similarly, factory interface robot 132 also includes the ability to rotate, extend, pivot, and vertically move its substrate support blade, while also allowing for linear travel along the robot track 150 that extends from the factory interface 130 to the mainframe 113.

Generally, the processing cell locations 102, 104, 106, 108, 110, 112, 114, 116 may be any number of processing cells utilized in a substrate processing system. More particularly, the processing cells or locations may be configured as electrochemical plating cells, rinsing cells, bevel clean cells, spin rinse dry cells, substrate surface cleaning cells (which collectively includes cleaning, rinsing, and etching cells), electroless plating cells (which includes pre and post clean cells, activation cells, deposition cells, etc.), metrology inspection stations, and/or other processing cells that may be beneficially used in conjunction with a deposition processing system and/or platform.

Each of the respective processing cell locations 102, 104, 106, 108, 110, 112, 114, 116 and robots 132, 120 are generally in communication with a process controller 111, which may be a microprocessor-based control system configured to receive inputs from both a user and/or various sensors positioned on the system 100, and appropriately control the operation of system 100 in accordance with the inputs and/or a predetermined processing recipe. Additionally, the processing cell locations 102, 104, 106, 108, 110, 112, 114, 116 are also in communication with a fluid delivery system (not shown) configured to supply the necessary processing fluids to the respective processing cell locations during processing, which is also generally under the control of system controller 111. An exemplary processing fluid delivery system may be found in commonly assigned U.S. patent application Ser. No. 10/438,624, entitled "Multi-Chemistry Electrochemical Processing System," filed on May 14, 2003, which is hereby incorporated by reference in its entirety to the extent not inconsistent with the present invention.

In an exemplary electroless deposition system 100, as illustrated in FIG. 1, the processing cell locations 102, 104, 106, 108, 110, 112, 114, 116 may be configured as follows. Processing cell locations 114 and 116 may be configured as an interface between the wet processing stations on the mainframe 113 and the generally dry processing stations or regions in the link tunnel 115, annealing station 135, and the factory interface 130. The processing cell locations 114, 116 located at the interface may be spin rinse dry cells and/or substrate cleaning cells, for example. Each of the processing cell locations 114 and 116 may include a spin rinse dry cell and a substrate cleaning cell in a stacked configuration. Alternatively, processing cell location 114 may include a spin rinse dry cell, while cell location 116 may include a substrate cleaning cell. In yet another embodiment, each of the cell locations 114, 116 may include a combination spin rinse dry cell and substrate cleaning cell. A detailed description of an exemplary spin rinse dry cell that may be used in embodiments of the invention may be found in commonly assigned U.S. patent application Ser. No. 10/680,616, entitled "Spin Rinse Dry Cell," filed on Oct. 6, 2003, which is hereby incorporated by reference in its entirety to the extent not inconsistent with the present invention.

Processing cell locations 106, 108 may be configured as substrate cleaning cells, and more particularly, processing cell locations 106, 108 may be configured as substrate bevel cleaning cells, i.e., cells configured to remove excess deposition from the perimeter, and optionally, the backside of a substrate after a deposition process has been completed. An exemplary bevel cleaning cell is described in commonly assigned U.S. patent application Ser. No. 10/826,492, entitled "Integrated Bevel Clean Chamber," filed on Apr. 16, 2004, which is hereby incorporated by reference in its entirety to the extent not inconsistent with the present invention. Embodiments of the invention further contemplate that processing cell locations 106, 108 may be omitted from system 100, if desired. Additionally, processing cell locations 106, 108 may be configured as electroless processing cells or cell pairs, as will be further discussed herein.

Processing cell locations 102, 104 and 110, 112 may be configured as electroless processing cells. The electroless processing cells 102, 104, 110, 112 may be positioned on the mainframe 113 within processing enclosures 302 in a configuration where two processing cells are positioned in each processing enclosure 302, i.e., processing cells 110 and 112 may operate as a first and second processing cells in a first processing enclosure 302, and processing cells 102 and 104 may operate as a third and fourth processing cells 302 in a second processing enclosure 302. Additionally, as noted above, embodiments of the invention contemplate that processing cell locations 106 and 108 may have a processing enclosure 302 positioned over the processing cell locations 106, 108, and these processing cell locations 106, 108 may be configured to operate in similar fashion to processing cell locations 102, 104, 110, 112, if desired.

The electroless processing cells positioned in the processing enclosures 302 may include plating or plating support cells, e.g., electrochemical plating cells, electroless plating cells, electroless activation cells, and/or substrate rinse or clean cells. In the exemplary electroless processing system 100, one fluid processing cell in each pair of cells on platform 100 will be an activation cell and the other processing cell of the pair will be an electroless deposition cell. This configuration will generally be duplicated on the opposing side of the platform 100 in the opposing processing enclosure 302. For example, although the invention is not limited to any particular configuration, processing cell location 102 may be configured as an electroless activation cell, while processing cell location 104 is configured as an electroless deposition cell. Similarly, processing cell location 112 may be configured as an electroless activation cell, while processing cell location 110 is configured as an electroless deposition cell. The processing cells in the respective processing enclosures 302 generally operate independently from each other under the control of system controller 111.

Figure 2:
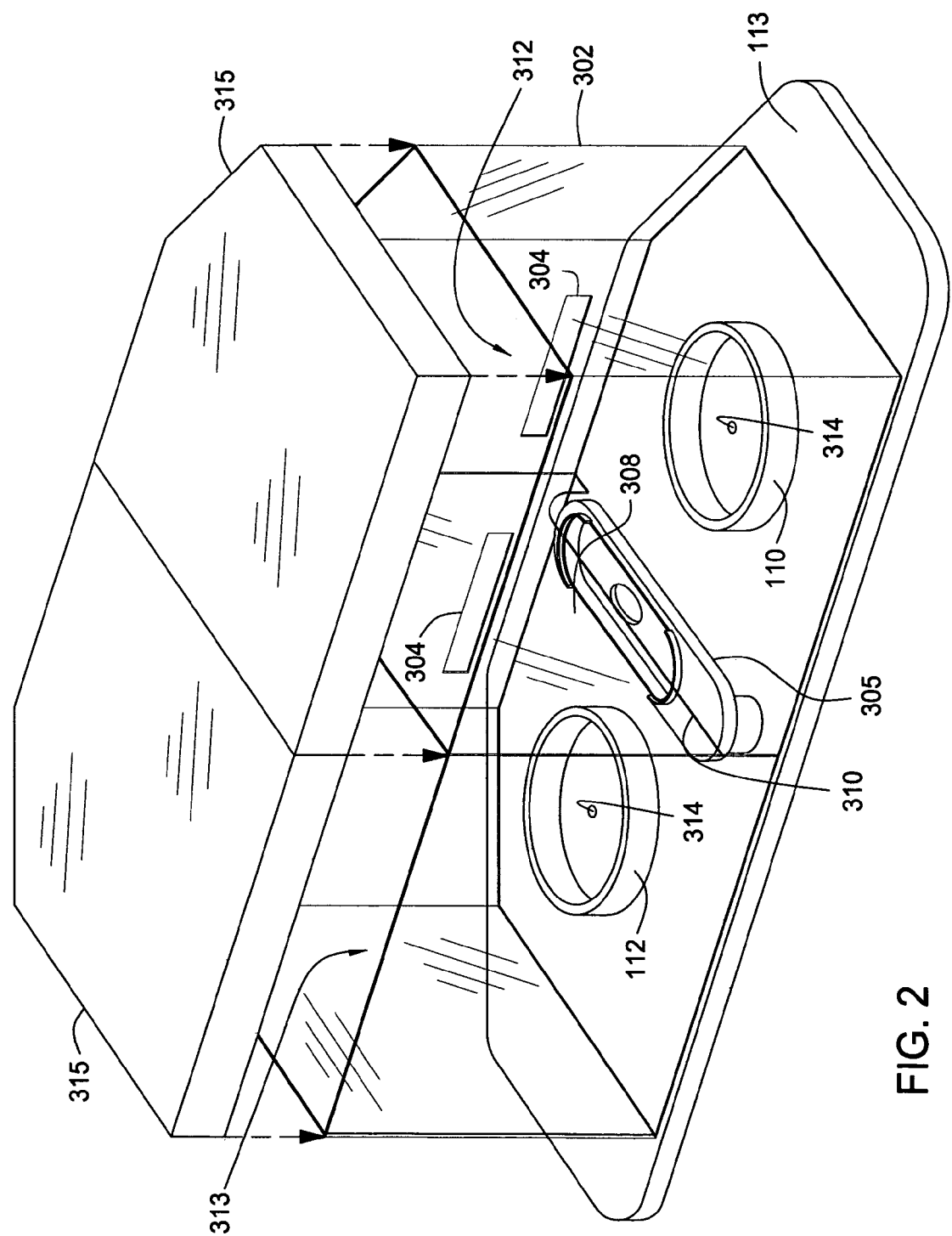
FIG. 2 is a perspective view of an exemplary deposition system.

FIG. 2 is a perspective view of an exemplary deposition system with the hardware of the processing cell locations 110, 112 omitted for clarity. An enclosure 302 defines a controlled processing environment around the pair of processing cell locations 110, 112. The processing enclosure 302 may include a central interior wall 308 that generally bisects the processing volume into two equally sized processing volumes 312, 313. Although the central interior wall 308 is optional, when it is implemented, the central interior wall 308 generally creates a first processing volume 312 above processing cell location 110 and a second processing volume 313 above processing cell location 112. The first and second processing volumes 312, 313 are substantially isolated from each other by the central interior wall 308, however, a lower portion of the central interior wall 308 includes a notch or slot 310 formed therein. The notch 310 is sized to accommodate a substrate transfer shuttle 305 that is positioned between processing cell locations 110, 112. The substrate transfer shuttle 305 is generally configured to transfer substrates between the respective processing cells (110↔112) without requiring the use of the mainframe robot 120. Substrate transfer shuttle 305 may be a vacuum chuck-type substrate support member that is configured to pivot about a point such that a distal substrate supporting end of the shuttle 305 moves in the direction of arrow 303 (shown in FIG. 1) to transfer substrates between the respective processing cell locations 110, 112. Each of the respective processing volumes 312, 313 also includes a valved port 304 that is configured to allow a robot, such as mainframe robot 120 to access the respective processing volumes 312, 313 to insert and remove substrates therefrom.

Each of the respective processing volumes 312, 313 also includes an environmental control assembly 315 (shown in FIG. 2 removed from contact with the processing enclosure for clarity) positioned on an upper portion of the respective processing volumes 312, 313. The environmental control assembly 315 includes a processing gas source configured to provide a processing gas to the respective processing volumes 312, 313. The processing gas source is generally configured to provide a controlled volume of an inert gas, such as nitrogen, helium, hydrogen, argon, and/or mixtures of these or other gases commonly used in semiconductor processing, to the respective processing volumes 312, 313. The environmental control assembly 315 further includes a particle filtration system, such as a HEPA-type filtration system. The particle filtration system is used to remove particulate contaminants from the gas flow entering the processing volumes 312, 313. The particle filtration system is also used to generate a generally linear and equal flow of the processing gas toward processing cell locations below. The environmental control assembly 315 may further include devices configured to control humidity, temperature, pressure, etc. in the respective processing volumes 312, 313. The controller 111 may be used to regulate the operation of the environmental control assembly and exhaust port 314, along with other components of the processing system 100, to control the oxygen content within the processing volumes 312, 313 in accordance with either a processing recipe or inputs received from sensors or detectors (not shown) positioned in the processing volumes 312, 313.

In operation, the processing gas is generally provided to the processing volumes 312, 313 by the environmental control assembly 315. The introduction of the processing gas into the respective processing volumes 312, 313 operates to fill the interior of the enclosed processing environment with an inert gas, thus purging the interior of processing volumes 312, 313 of gases that may degrade the electroless plating process, such as oxygen, for example. Generally, the processing gas source introduces the processing gas into the processing volumes 312, 313 near the top or upper portion of the processing volumes 312, 313 above the processing cell locations 110, 112 and near the center of the respective processing volumes 312, 313. The processing gas is generally introduced into the processing volumes 312, 313 through a HEPA-type filtration system configured to minimize airborne particles and equalize both the flow rate and direction of the processing gas such that the gas is flowing linearly and at a continuous flow rate toward the processing cell locations 110, 112.

Each of the processing cell locations 110, 112 also includes at least one exhaust port 314 (or multiple radially positioned ports 314 if desired) positioned to facilitate uniform flow of the processing gas from the gas supply in the environmental control assembly 315 toward the processing cell locations 110, 112. The exhaust port 314 may be positioned below the substrate being processed at the respective processing locations 110, 112, or alternatively, the exhaust port 314 may be positioned radially outward from the respective processing locations 110, 112. Regardless of positioning, the exhaust port 314 is configured to facilitate uniform flow of the processing gas while optionally evacuating fluid and chemical vapors from the respective processing locations 110, 112.

A typical process for supplying the inert gas to the processing volumes 312, 313 includes supplying the inert gas at a flow rate of between about 10 slm and about 300 slm, or more particularly, between about 12 slm and about 80 slm. The flow rate of the inert gas may be reduced when the respective processing volumes 312, 313 are closed, i.e., when the valved access ports 304 are closed. When the valved ports 304 are open, i.e., when substrates are being transferred into or out of the processing enclosure 302, the processing gas flow rate is increased to create an outflow of gas from the processing enclosure 302. This outflow of gas is configured to prevent ambient gases, and in particular oxygen, from entering into the interior of the processing enclosure. Once the valved ports 304 are closed, the processing gas flow rate may be decreased to a flow rate that accommodates substrate processing. This flow rate may be maintained for a period of time prior to initiating substrate processing, so that any incoming oxygen may be removed from the processing volumes 312, 313 prior to initiating a processing sequence. The exhaust port 314 works cooperatively with the processing gas supply to remove oxygen from the processing volumes 312, 313. The exhaust port 314 is generally in communication with a standard fabrication facility exhaust system and is used to remove processing gases from the processing volumes 312, 313. In alternative embodiments of the invention, the processing volumes 312, 313 may include a vacuum pump positioned in fluid communication with the processing volumes 312, 313. The vacuum pump may be used to further reduce the presence of unwanted gases in the processing volumes 312, 313. Regardless of the exhaust or pump configurations, the environmental control assemblies 315 are generally configured to maintain the oxygen content in the interior of the processing volumes 312, 313 below about 500 ppm during substrate processing, and more particularly, below about 100 ppm during substrate processing.

The combination of the environmental control assembly 315, the exhaust port 314, and the system controller 111 also allows system 100 to control the oxygen content of the processing volumes 312, 313 during specific processing steps, wherein one processing step may require a first oxygen content for optimal results and a second processing step may require a second oxygen content for optimal results, where the first and second oxygen contents are different from each other. In addition to the oxygen content, controller 111 may be configured to control other parameters of the processing enclosure, such as temperature, humidity, pressure, etc. as desired for a particular processing sequence. These specific parameters may be modified by heaters, chillers, humidifiers, dehumidifiers, vacuum pumps, gas sources, air filters, fans, etc., all of which may be included in the environmental control assembly 315 and positioned in fluid communication with the processing volumes 312, 313 and controlled by the system controller 111.

The processing volumes 312, 313 are generally sized to facilitate electroless plating processes, i.e., processing volumes 312, 313 are sized such that the gas supply of the environmental control assembly 315 can maintain a low oxygen content (generally less than about 500 ppm, or more particularly, less than about 100 ppm) during a processing step, while also allowing for sufficient volume to support evaporation of fluid solutions in the volume without vapor saturation of the processing volumes 312, 313. As such, the vertical distance from the upper surface of the substrate positioned in one of the processing locations 110, 112 to the top of the processing volume 312, 313 across the area of the processing location (this volume is generally referred to as the head space) is generally between about 6 inches and about 40 inches high and has the diameter or cross section of the processing location 110, 112. More particularly, the head space may be between about 12 inches and about 36 inches in height, and the horizontal dimension of the processing volumes 312, 313 generally approximates the perimeter of the respective processing locations 110, 112, which are generally sized to be between about 10% and about 50% larger than the diameter of the substrates being processed in the respective processing locations 110, 112. These dimensions are important to the operation of the apparatus of the invention, as it has been shown that smaller processing volumes are prone to vapor saturation, which has a negative impact on electroless plating processes. As such, the inventors have determined that adequate head space (the cross sectional area of the processing location over the distance from the substrate to the top of the enclosure) is important to prevent vapor saturation and defects that may be associated therewith.

In terms of volume of head space generally required to prevent vapor saturation, the inventors have found that the head space for each processing location 110, 112 will generally be between about 1000 in$^3$ and about 5000 in$^3$ for a 300 mm processing location. As such, the head space for the processing volumes 312, 313 of the invention when configured for 300 mm substrate processing will generally be between about 1500 in$^3$ and about 5000 in$^3$, or between about 2000 in$^3$ and about 4000 in$^3$, or between about 2000 in$^3$ and about 3000 in$^3$, for example.

While the processing volumes 312, 313 are generally isolated from each other, the slot 310 allows for gases in one processing volume to pass into the adjacent processing volume. As such, embodiments of the invention provide for a higher pressure in one processing volume than in the adjacent processing volume. This pressure differential allows for control over the cross talk between the respective processing volumes 312, 313, as the gas flow between the processing volumes will be in the same direction and at the same rate if the pressure differential is maintained. Accordingly, one of the processing cells can be configured as a cool processing cell, such as an activation cell, and the other processing cell can be configured as a heated processing cell, such as an electroless deposition cell. In this embodiment, the heated processing cell is pressurized to a higher pressure, and as such, the heated fluid processing cell is always flowing gases through the slot 310 into the cooler fluid processing cell. This configuration prevents the cooler processing cell from reducing the temperature of the heated processing cell, as the heated processing cell, i.e., the electroless deposition cell, is generally more susceptible to defects as a result of temperature variation than cooled fluid processing cell, i.e., the activation cell.

In another embodiment, the respective processing volumes 312, 313 may be completely isolated from each other by the central interior wall 308, i.e., substrate shuttle 305 and wall slot 310 are removed. In this embodiment, the mainframe robot 120 may be used to service or access each of the isolated processing volumes 312, 313 individually via the respective access valves 304 and may operate to transfer substrates between the respective processing volumes 312, 313.

Figure 3:
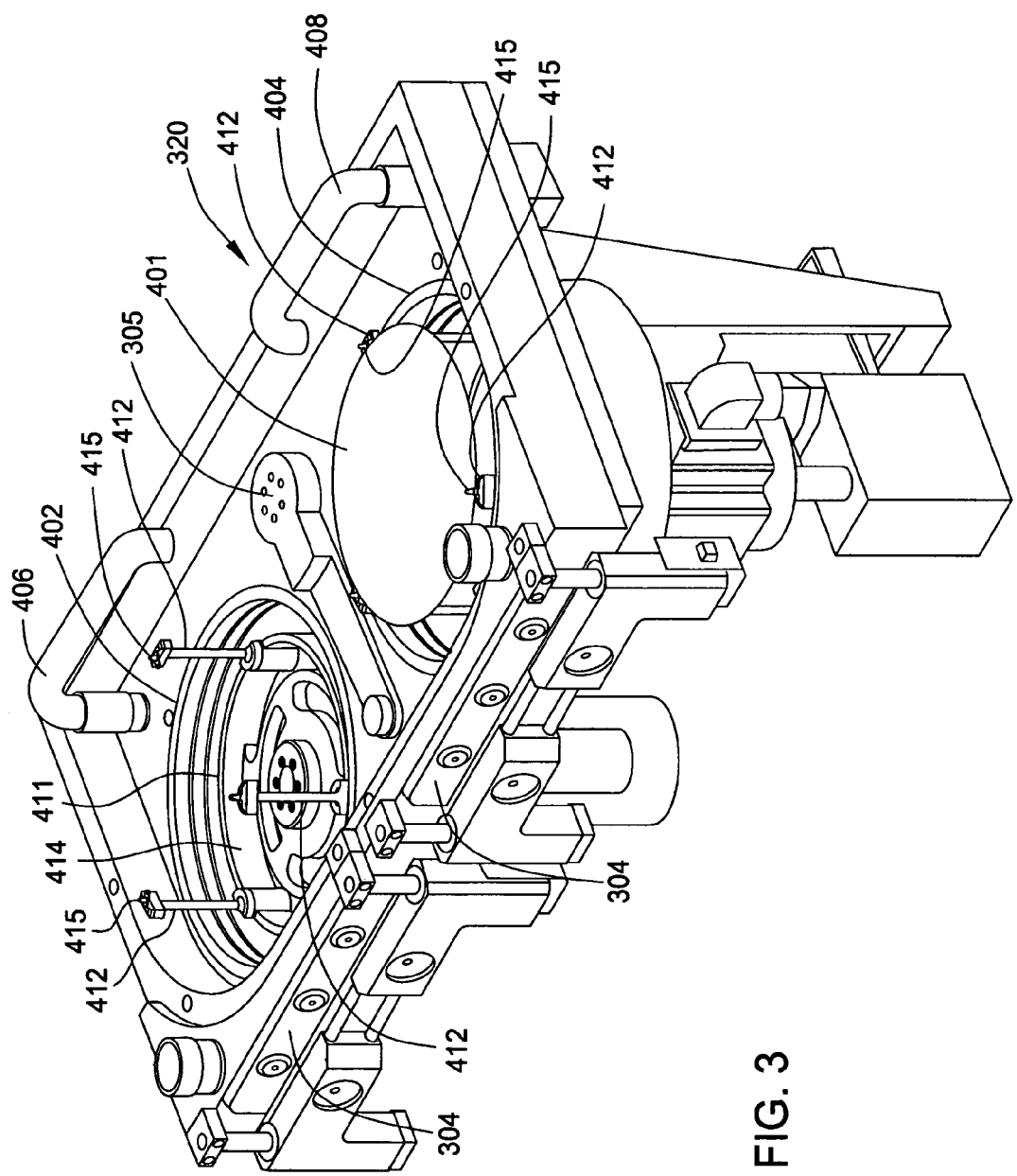
FIG. 3 is a perspective view of an exemplary deposition system with the enclosure removed.

FIG. 3 is a perspective view of an exemplary deposition station 400 with the enclosure 302 removed therefrom. The deposition station 400 generally represents an embodiment of the processing cells illustrated in FIGS. 1 and 2. The processing cells illustrated in deposition station 400 may be an eleotroless activation station 402 and an electroless deposition station 404. The substrate transfer shuttle 305 is positioned between stations 402, 404 and is configured to transfer substrates between the respective stations 402, 404. Each of stations 402, 404 includes a rotatable substrate support assembly 414 that is configured to support a substrate 401 for processing in the respective station in a face up orientation, i.e., the processing surface of the substrate 401 is facing away from the support assembly 414. In FIG. 3, station 402 does not have a substrate 401 illustrated on the substrate support assembly 414, while station 404 has a substrate 401 supported on the support assembly 414 to show the respective stations in both a loaded and empty states. Generally, the hardware configuration of the respective stations 402, 404 will be the same, however, embodiments of the invention are not limited to configurations where the stations 402, 404 have identical hardware therein. For example, the inventors contemplate that the deposition station 404 may have a temperature controlled platen 403, which is further described herein, while the activation station 402 may be configured without the temperature controlled platen 403.

Figure 4:
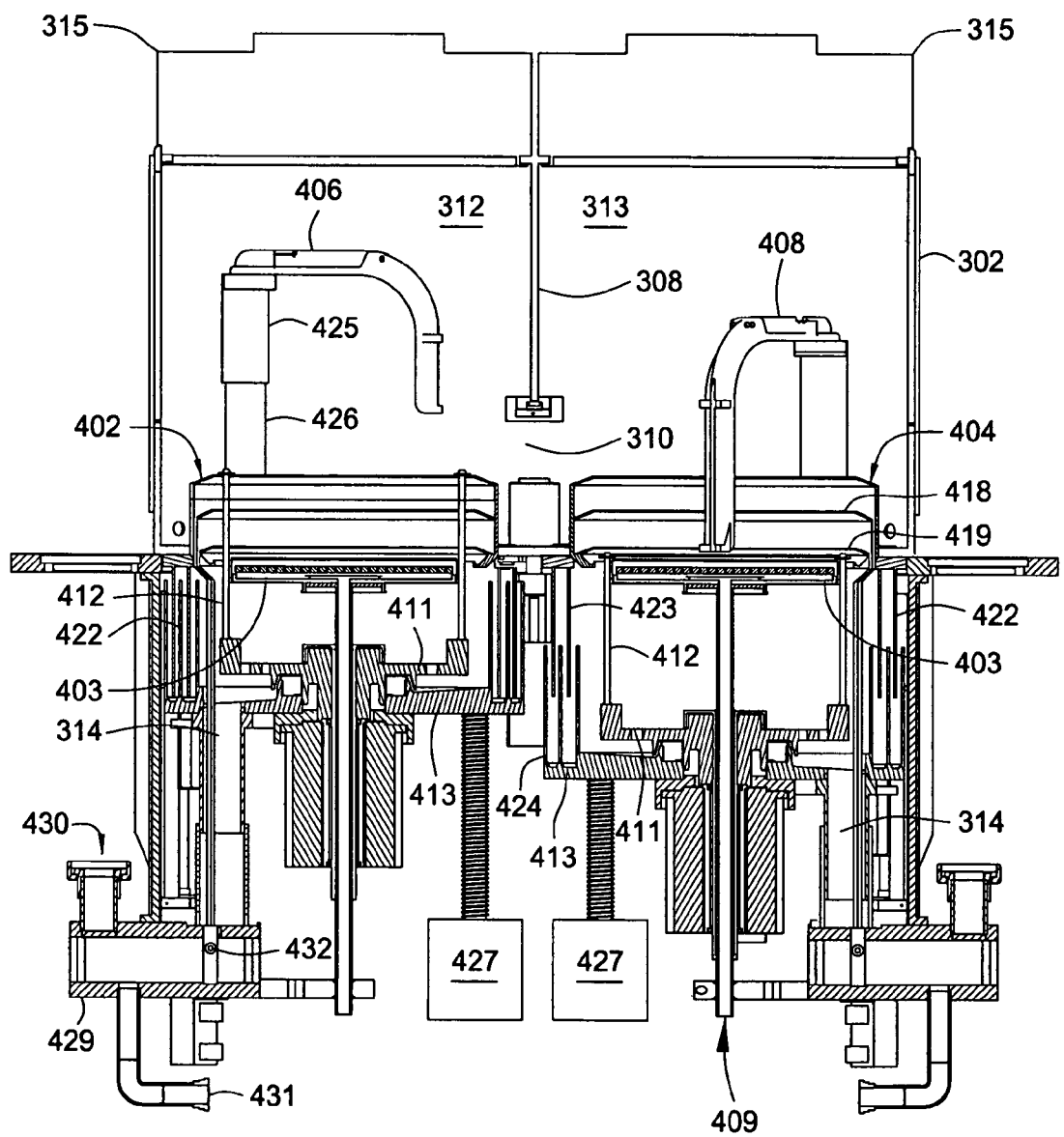
FIG. 4 is a sectional view of an exemplary deposition system.

The substrate support assembly 414, which is also shown in the sectional view of FIG. 4, includes a support ring structure 411 having a plurality of vertically extending substrate support fingers 412 extending therefrom. The substrate support fingers 412 generally include an upper horizontal surface configured to support an edge or bevel of a substrate 401, as generally illustrated at processing station 404 in FIG. 3 and in the sectional view of FIG. 4. The substrate support fingers 412 may further include a vertical post member 415 positioned to center the substrate 401 on the respective fingers 412. The substrate support assembly 414 further includes a lift assembly 413, which is illustrated and further described herein with respect to FIG. 4, that is configured to vertically actuate ring 411, and thus fingers 412, to load and unload substrates 401 from the respective stations 402, 404.

The respective stations 402, 404 each include a fluid dispensing arm 406, 408 that is configured to pivot over the substrate 401 during processing to dispense a processing fluid onto the front side or production surface of the substrate 401. The fluid dispensing arms 406, 408 may also be configured to be positioned vertically with respect to the substrate, i.e., the fluid dispensing portion of the arms 406, 408 may be positioned between about 0.5 mm and about 30 mm, or more particularly, between about 5 mm and about 15 mm, or between about 4 mm and about 10 mm from the surface of the substrate 401 being processed. The vertical and/or angular position of the fluid dispensing portion of the arms 406, 408 may be adjusted during processing of a substrate if desired. The dispensing arms 406, 408 may include more than one fluid conduit therein, and as such, the dispensing arms 406, 408 may be configured to dispense multiple fluid solutions therefrom onto the substrate 401.

Exemplary solutions that may be dispensed by either arm 406 or arm 408 include rinsing solutions, cleaning solutions, activating solutions, electroless plating solutions, and other fluid solutions that may be necessary to support an electroless deposition process. Additionally, the fluid conduits (not shown) in the respective arms 406, 408 may be heated/cooled to control the temperature of the fluids dispensed therefrom. Heating/cooling in the arm conduits provides advantages, namely, that the fluid does not have time to cool before being dispensed onto the substrate while traveling through the conduits. This configuration, therefore, operates to improve electroless deposition uniformity, which is dependent upon temperature. Further, the terminating end of the fluid dispensing arms 406, 408, i.e., the location where the processing fluid is dispensed, is movably positioned in embodiments of the invention. As such, the spacing between the fluid dispensing portion of the arms 406, 408 and the substrate surface may be adjusted. This spacing operates to minimize splashing of the processing solutions and allows for control over the positioning of the fluid dispensing operations onto the production surface.

FIG. 4 is a sectional view of an exemplary pair of processing stations 402, 404. The sectional view of FIG. 4 also shows the enclosure 302 that defines the first and second processing volumes 312, 313 that are divided by the central interior wall 308, as described above with respect to FIG. 2. Each of the processing stations 402, 404 includes a substrate processing platen assembly 403 that forms a substantially horizontal upper surface configured to be positioned immediately below a substrate during processing. The platen assembly 403, which is also illustrated in the detailed sectional view of FIG. 5, collectively includes a fluid diffusion member 405 positioned over a base plate member 417 such that the fluid diffusion member 405 and the base plate member 417 form a fluid volume 410 therebetween. A fluid supply conduit 409 is in fluid communication with the fluid volume 410, and a fluid flow baffle 416 is attached to the base plate member 417 and is positioned in the fluid volume 410 between the terminating end of the supply conduit 409 and a lower surface of the fluid diffusion member 405.

The fluid diffusion member 405 includes a plurality of fluid holes 407 formed therethrough that connect an upper surface of the fluid diffusion member 405 to a lower surface of the fluid diffusion member 405. A perimeter portion of the fluid diffusion member 405 is generally in sealed communication with the base plate member 417, and as such, fluid may be introduced into the fluid volume 410 by fluid supply conduit 409 and caused to flow through the holes 407 formed in the diffusion member 405 as a result of the increasing fluid pressure generated in the sealed fluid volume 410 by the fluid introduction.

The fluid diffusion member 405 may include between about 10 and about 200 fluid holes 407 that generally have a diameter of between about 0.5 mm and about 15 mm, or more particularly, a diameter of between about 0.7 mm and about 3 mm. The holes 407 may be positioned vertically, or alternatively, at an angle with respect to the upper surface of the diffusion member 405. The holes 407 may be positioned at an angle of between about 5° and about 45° from vertical to facilitate an outward fluid flow pattern across the surface of the diffusion member 405. Further, the angled holes 407 may be configured to reduce fluid turbulence.

In another embodiment of the invention, the fluid diffusion member 405 may comprise a porous material, such as a porous ceramic, for example, configured to allow fluid to flow therethrough. In this embodiment, the holes 407 are generally not required, however, the inventors have contemplated implementing some holes 407 in conjunction with the porous fluid diffusion member 405 to increase fluid flow where necessary.

In another embodiment of the invention, the base plate 417 may have a plurality of fluid supply conduits 409 formed therethrough, wherein each of the fluid supply conduits 409 is configured to supply fluid to individual and/or particular holes 407. More particularly, this embodiment may be used to implement a zoned fluid supply system, wherein separate heated fluids are supplied to different areas of the backside of the substrate via individual or groups of holes 407, thus providing control over the temperature variation across the substrate as a result of the position of the individual holes 407 and the temperature of the heated fluid flowing through the individual holes 407. This embodiment may be used to generate increased temperatures near the center or edge of the substrate during processing, for example.

The base plate 417 and diffusion member 405 may be manufactured from a ceramic material (such as fully pressed aluminum nitride, alumina $Al_2O_3$, silicon carbide (SiC)), a polymer coated metal (such as Teflon™ polymer coated aluminum or stainless steal), a polymer material, or other material suitable for semiconductor fluid processing. Preferred polymer coatings or polymer materials are fluorinated polymers such as Tefzel (ETFE), Halar (ECTFE), PFA, PTFE, FEP, PVDF, etc. A more detailed description of the configuration, components, and operation of the fluid processing cell 500 of the invention may be found in commonly assigned U.S. patent application Ser. No. 10/680,325, filed on Oct. 6, 2003, now U.S. Pat. No. 7,223,308, entitled "Apparatus to Improve Wafer Temperature Uniformity for Face-up Wet Processing", which is hereby incorporated by reference in its entirety to the extent not inconsistent with the present invention.

In operation, a substrate 401 is secured by the fingers 412 and is vertically positioned just above the fluid diffusion member 405. The space between the fluid diffusion member 405 and the substrate 401 is filled with a temperature controlled fluid dispensed by conduit 409 through diffusion member 405. The fluid contacts the backside of the substrate 401 and transfers heat thereto to heat the substrate. In this embodiment, the substrate is generally positioned in parallel relationship to the upper surface of the diffusion member 405 and between about 0.1 mm and about 15 mm away from the upper surface of the diffusion member 405, and more particularly between about 0.5 and about 2 mm away from the upper surface of the diffusion member 405.

In another embodiment of the invention, the interior of the platen assembly 403 may include a heater 433, which may be a resistive-type heater that is configured to increase the temperature of the platen assembly 403 to heat the substrate 401 being processed. Similarly, the fluid conduit 409 and/or the fluid supply may include a heating device configured to heat the fluid passing through the conduit 409 prior to the fluid contacting the substrate 401 positioned on the support fingers 412. The heaters may be in communication with the system controller 111, such that the controller 111 may regulate the operation of the respective heaters to control the temperature of the fluid and the substrate being processed.

The process of positioning a substrate 401 for processing generally involves moving the lift assembly 413 between a loading position and a processing position. The lift assembly 413 is illustrated in a loading position in the left processing station 402 of FIG. 4, where the lift assembly is in a vertical position such that support fingers 412 extend above upper catch ring 418. In this position, the fluid dispensing arm 406 is vertically spaced above the fingers 412 to allow for loading of a substrate 401. The arm 406 (and the other fluid dispensing arms of the deposition system) includes a stationary base member 426 that telescopically receives an upper arm member 425. A drive motor telescopically moves that upper arm member 425 relative to the base member 426 to adjust the vertical position of the arm 406. The substrate 401 is positioned above the support fingers 412 by the mainframe robot 120 or the substrate shuttle 305, and then the fingers 412 may be vertically actuated to remove the substrate 401 from the respective robot/shuttle 120, 305. Once the substrate 401 is supported by the fingers 412 above the robot/shuttle 120, 305, then the robot/shuttle 120, 305 may be removed from below the substrate 401, and the fingers 412 may be lowered into a processing position.

The lift assembly 413 is illustrated in a processing position in the right processing station 404 of FIG. 4, where the lift assembly 413 is vertically positioned such that the fingers 412 position the substrate 401 at a vertical position proximate one of the catch rings 418, 419. In the processing position, the fluid dispensing arm 408 is lowered and positioned proximate the upper surface of the substrate 401, as illustrated at processing station 404 in FIG. 4. The lift assembly 413 is generally actuated by a powered jack screw assembly 427 configured to vertically actuate the lift assembly 413 and the components attached thereto. More particularly, the lower portion of the fluid processing cell is attached to the lift assembly 413 and moves cooperatively therewith. The lower portion of the processing cell generally includes the substrate support assembly 414 (including fingers 412 and ring 411), the lower interleaving walls 424, and the exhaust 314. The platen assembly 403 remains stationary and does not move concomitantly with the lift assembly 413.

The lower portion of each of the respective processing stations 402, 404 each includes a plurality of interleaving wall assembly 422. The interleaving wall assembly 422 is configured to cooperatively move with the lift assembly 413 between the loading position illustrated at processing station 402 in FIG. 4 and the processing position illustrated at processing station 404 in FIG. 4. The interleaving wall assembly 422 generally includes upper interleaving walls 423, which are rigidly attached to the mainframe 113, and lower interleaving walls 424, which are attached to the lift assembly 413 and configured to move therewith. The lower interleaving walls 424 (specifically the innermost pair of walls 424 positioned closest to the cell) may be filled with a fluid, such as deionized water, that operates to seal the lower portion of the processing stations 402, 404 from the environment outside of the enclosed environment. The deionized water is generally continually supplied to the space between the lower interleaving walls 424 through a drip mechanism, for example. The use of the fluid sealing interleaving wall assembly 422 allows the processing stations 402, 404 of the invention to decouple the rotational seal of the stations 402, 404 from the vertical seal of the stations, i.e., in conventional cells both the rotational and vertical seals were positioned on a common shaft, such as conduit 409 in the present invention. The interleaving wall assembly 422 allows the seal 428 illustrated in FIG. 7 to be only a rotational seal, and not a combination of a rotational seal and a vertical sliding seal, which are difficult to operate in fluid processing systems.

Figure 5:
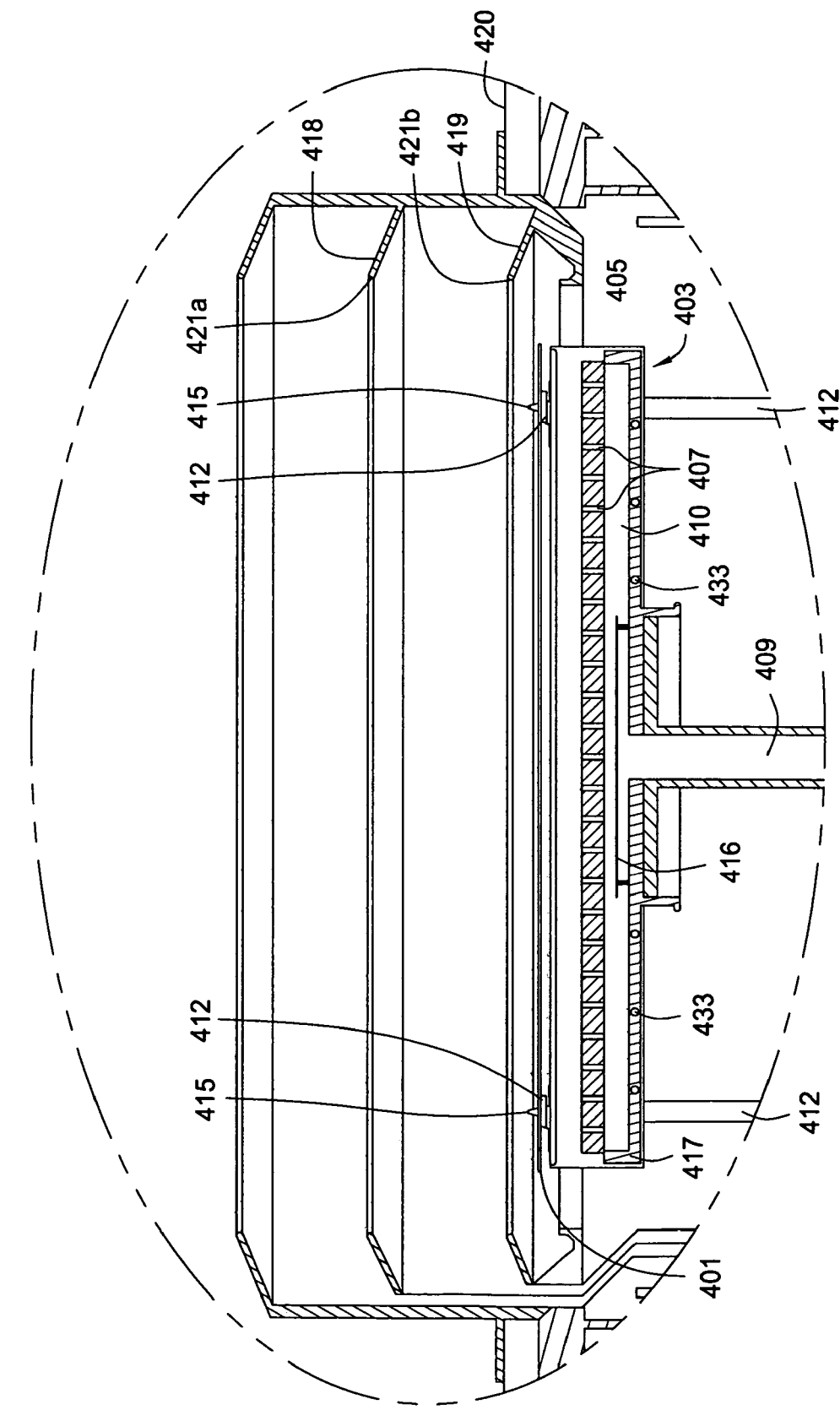
FIG. 5 is a sectional view of an exemplary fluid processing station.
Figure 6:
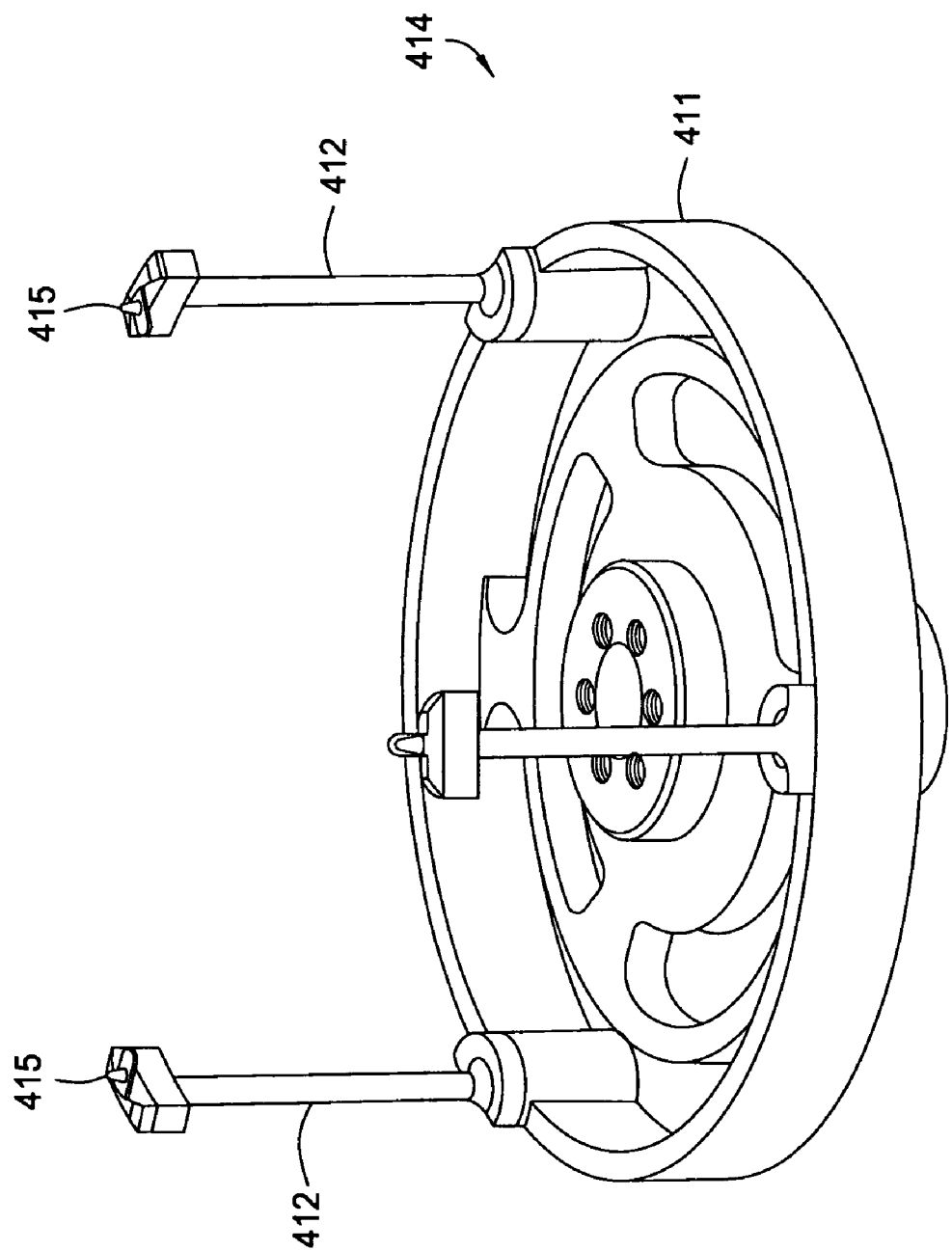
FIG. 6 is a perspective view an exemplary substrate support assembly.
Figure 7:
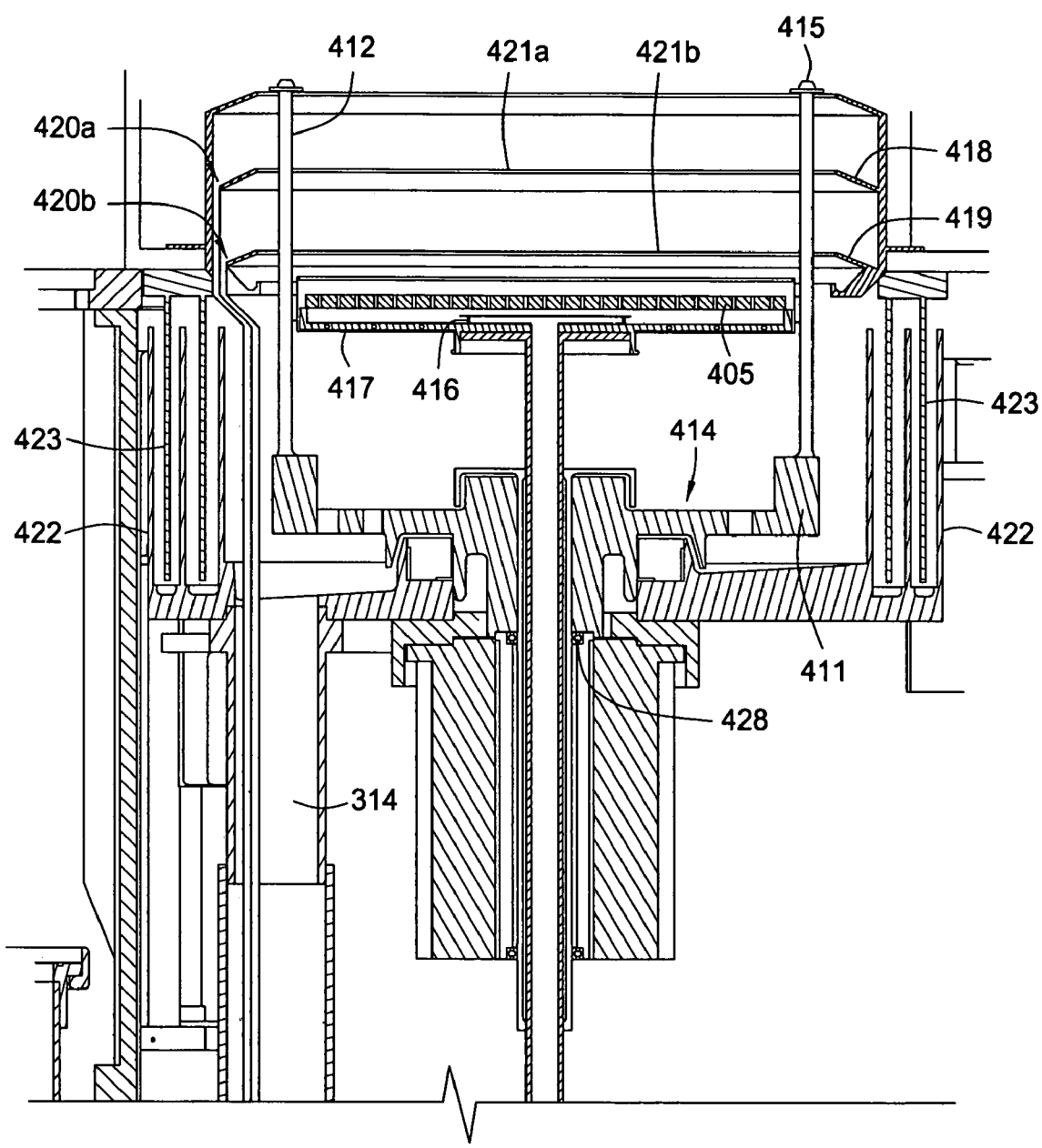
FIG. 7 is a sectional view of an exemplary fluid processing station.

As noted above, each of the stations 402, 404 may also include an upper fluid catch ring 418 and a lower fluid catch ring 419, as illustrated in FIGS. 4 and 5. The respective catch rings 418, 419 generally comprise annularly shaped members that extend inwardly and upwardly from an inner wall of the respective stations 402, 404. The rings 418, 419 may be attached to the inner wall of the cells or may be an integral part of the inner wall of the cells. The inner terminating edge 421a, 421b of catch rings 418, 419 is generally sized to have a diameter that is between about 5 mm and about 50 mm larger than the diameter of the substrate 401 being processed. As such, the substrate 401 may be vertically raised and lowered through the respective rings 418, 419 during processing. Additionally, each of the catch rings 418, 419 also includes a fluid drain 420a, 420b respectively, configured to collect processing fluids landing on the fluid catch rings 418, 419. The fluid drains 420a, 420b are in fluid communication with the exhaust port 314, as shown in FIG. 7. The exhaust port 314 connects to a separation box 429, where the gases and fluids may be separated from each other. Separation box 429 includes a gas exhaust port 430 positioned on an upper portion of the box 429, and a fluid exhaust 431 positioned on a lower portion of the box. Separation box 429 further includes a recapture port 432 that is configured to communicate processing fluids collected on catch rings 418, 419 to a reclamation device for reuse.

The catch rings 418 and 419 are configured to allow for fluid processing of a substrate 401 at multiple vertical locations within each of the processing stations 402, 404. For example, a substrate 401 may be positioned such that the upper surface of the substrate 401 is positioned slightly above the terminating end 421a of the upper catch ring 418 for a first fluid processing step. A first processing fluid may be dispensed onto substrate 401 by a fluid dispensing arm 406, 408 while the substrate 401 is rotated at between about 5 rpm and about 120 rpm. The rotation of the substrate 401 causes the fluid dispensed onto the substrate to flow radially outward off of the substrate. As the fluid flows over the edge of the substrate is travels outward and downward and is received on the upper catch ring 418. The fluid may be captured by the fluid drain 420a and recirculated for subsequent processing if desired.

Once the first fluid processing step is complete, the substrate 401 may be vertically moved to a second processing position where the upper surface of the substrate 401 is positioned slightly above the terminating end 421b of the lower catch ring 419 for a second fluid processing step. The substrate 401 is processed in this position in similar fashion to the first fluid processing step and the fluid used in the process may be collected by a fluid drain 420b. An advantage of this configuration is that multiple fluid processing chemistries may be used in a single processing station. Additionally, the fluid processing chemistries may be compatible or incompatible, as the separate fluid catch rings 418, 419 that each have independent fluid drains 420a, 420b allows for separate collection of incompatible processing fluids.

In operation, embodiments of the deposition system 100 of the invention may be used to conduct an electroless preclean process, an electroless activation process, an electroless plating process, an electroless post clean process, and/or other processing steps that may be used in an electroless process. An exemplary process sequence for conducting an electroless plating process using embodiments of the invention will now be described with respect to the embodiments of the invention illustrated in FIGS. 1-5. An electroless plating process generally begins with the insertion of a substrate into the enclosed processing environment 302. The insertion process generally includes opening the valved access port 304 and inserting a substrate 401 into the processing environment 302 with the mainframe robot 120. The substrate 401 is inserted in a face up orientation, i.e., the surface of the substrate 401 to be plated is facing upward.

Once the substrate is inserted into the enclosed processing environment 302, the mainframe robot 120 positions the substrate onto the support fingers 412 in processing station 402, and the mainframe robot retracts from the processing enclosure 302. The fingers 412 may then vertically position the substrate 401 for processing, while valved access port 304 is closed. During the insertion process, i.e., during the time period when the valved access port 304 is open, the gas supply in the environmental control assembly 315 is on and is caused to fill the enclosed processing environment 302 with an inert processing gas. The process of flowing the inert gas into the processing volume causes an outward flow of the processing gas through the valved port 304 that is configured to prevent ambient gasses, oxygen in particular, from entering the enclosed processing environment 302, as oxygen is known to have a detrimental effect (oxidation) on plated materials, and in particular, copper. The flow of the processing gas is continued after the valved access port 304 is closed, and is generally on before the valved access port 304 is opened. The flow of processing gas is continued during the electroless cleaning, activation, and plating sequence and the exhaust port 314, a gas vent, and/or vacuum pump may be used to maintain a desired processing pressure in the enclosed processing environment 302 once the valved access port 304 is closed. The combination of the gas supply, a HEPA filter, and the exhaust port 314 are used to control the oxygen content in the enclosed processing environment 302 during particular processing steps, i.e., the oxygen content in the enclosure 302 may be controlled and optimized for each individual processing step if desired.

Once the substrate is positioned in the processing cell, the electroless plating processes of the invention generally begin with a substrate pre-cleaning process. The precleaning process begins with the upper surface of the substrate being positioned slightly above, generally between about 2 mm and about 10 mm, the terminating end 421a of the upper catch ring 418. The cleaning process is accomplished via a cleaning solution being dispensed onto the substrate surface by the fluid dispensing arm 406. The cleaning solution may be dispensed onto the substrate surface during the lowering process to save process time and increase throughput of the cell. The cleaning solution may be an acidic or basic solution, depending upon the desired cleaning characteristics, and the temperature of the cleaning solution may be controlled (heated or cooled) in accordance with a processing recipe. Additionally, the cleaning solution may include a surfactant additive. The rotation of the substrate, which is generally between about 10 rpm and about 60 rpm, causes the cleaning solution to flow radially outward off of the substrate and onto the upper catch ring 418, where the cleaning solution is captured, transmitted to drain 420a, and then communicated to separation box 429 via the exhaust port 314 for separation and recycling, if desired.

Once the substrate has been cleaned, the substrate surface is generally rinsed. The rinsing process includes dispensing a rinsing solution, such as deionized water, onto the substrate surface while rotating the substrate. The rinsing solution is dispensed at a flow rate and temperature configured to effectively remove any residual cleaning fluid from the substrate surface. The substrate is rotated at a speed sufficient to urge the rinsing solution off of the surface of the substrate, i.e., between about 5 rpm and about 120 rpm, for example.

Once the substrate has been rinsed, a second rinsing step may be employed. More particularly, prior to an activation step, which generally includes application of an acidic activation solution to the substrate surface, the substrate surface may first be treated with an acidic conditioning rinse solution. The conditioning rinse solution generally includes an acid, such as the acid used in the activation solution, for example, which operates to condition the substrate surface for the application of the acidic activation solution. Exemplary acids that may be used for conditioning solutions include nitric acid, chloride based acids, methyl sulfonic acids, and other acids commonly used in electroless activation solutions. The substrate conditioning process may be conducted at a processing position adjacent the upper catch ring 418, or the substrate may be lowered to a processing position adjacent the lower catch ring 419, depending upon the compatibility of the chemistry used for the conditioning process with the chemistry used for the pre-cleaning process.

Once the substrate has been conditioned, an activation solution is applied to the substrate surface with the substrate positioned proximate the lower catch ring 419. The activation solution is dispensed onto the substrate by arm 408 and is caused to flow radially outward over the edge of the substrate and onto the catch ring 419 as a result of the substrate being rotated. The activation solution is then collected by the fluid drain 420 for recirculation. The activation solution generally includes a palladium based solution having an acid foundation. During the activation step, the backside substrate surface, which is generally circular and similar in diameter to diffusion member 405, is generally positioned between about 0.5 mm and about 10 mm from the upper surface of the diffusion member 405. The space between the backside of the substrate and the diffusion member 405 is filled with a temperature controlled fluid, which may be deionized water that is dispensed from the fluid holes 407 formed into the diffusion member 405. The temperature controlled fluid (generally a heated fluid, but may also be a cooled fluid) dispensed from the holes 407 contacts the backside of the substrate and transfers heat to/from the fluid to the substrate to heat/cool the substrate for processing. The fluid may be continually supplied, or alternatively, a predetermined volume of the fluid may be supplied and then the fluid supply terminated. The flow of the fluid contacting the backside of the substrate may be controlled to maintain a constant substrate temperature during the activation process. Additionally, the substrate may be rotated at between about 10 rpm and about 100 rpm during the activation process to facilitate even heating/cooling and fluid spreading.

Once the substrate surface has been activated, an additional rinsing and/or cleaning solution may be applied to the substrate surface to clean the activation solution therefrom. A first rinsing and/or cleaning solution that may be used after activation includes another acid, preferably selected to match the acid of the activation solution. After the acid post rinse, the substrate may also be rinsed with a neutral solution, such as deionized water, to remove any residual acid from the substrate surface. The post activation cleaning and rinsing steps may be conducted at either the upper processing position or the lower processing position, depending upon the compatibility of the chemistries.

When the activation steps are completed, the substrate may be transferred from the activation station 402 to the deposition station 404 by the substrate shuttle 305. The transfer process includes raising the substrate out of the activation station 402 with the lift fingers 412, moving the shuttle 305 under the substrate, lowering the substrate onto the shuttle 305, and transferring the substrate from the activation station 404 to the deposition station 404. Once the substrate is in the deposition station 404, the substrate support fingers 412 for the deposition station 404 may be used to remove the substrate from the shuttle 305 and position the substrate for processing.

The positioning of the substrate generally includes positioning the substrate proximate the upper catch ring 418 for a pre-cleaning process. The precleaning process includes dispensing a precleaning solution onto the substrate with arm 408, wherein the precleaning solution is generally selected to have a similar pH as the electroless plating solution subsequently applied so that the precleaning solution may condition the substrate surface to the pH of the deposition solution. The precleaning solution may be a basic solution that is the same as the foundation for the electroless deposition solution that is to be applied after the conditioning step. The precleaning of the substrate surface with a solution having the same pH as the plating solution also improves the wetability of the substrate surface for the deposition process. The precleaning solution may be heated or cooled, as required by the processing recipe.

When the substrate surface has been conditioned by the basic solution, the next step in the electroless deposition process is to apply the plating solution to the substrate surface. The plating solution generally includes a metal, such as cobalt, tungsten, and/or phosphorous, etc. that is to be deposited onto the substrate surface in the form of a pure metal or an alloy of several metals. The plating solution is generally basic in pH and may include a surfactant and/or a reductant configured to facilitate the electroless plating process. The substrate is generally lowered to a position slightly above the lower catch ring 419 for the deposition step. As such, the deposition solution applied by arm 408 flows outward over the edge of the substrate and is received by the catch ring 419, where it may be collected by drain 420*b* for possible recycling. Additionally, the backside of the substrate is generally positioned between about 0.5 mm and about 10 mm, or between about 1 mm and about 5 mm away from the upper surface of the diffusion member 405 during the deposition step. The space between the backside of the substrate and the diffusion member 405 is filled with a temperature controlled (generally heated) fluid, which may be deionized water that is dispensed through the fluid holes 407 formed into the diffusion member 405. The temperature controlled fluid dispensed from the holes 407 contacts the backside of the substrate and transfers heat from the fluid to the substrate to heat the substrate for the deposition process. The fluid is generally continually supplied throughout the deposition process. The flow of the fluid contacting the backside of the substrate during the deposition process is controlled to maintain a constant substrate temperature during the deposition process. Additionally, the substrate may be rotated at between about 10 rpm and about 100 rpm during the deposition process to facilitate even heating and spreading of the deposition solution applied to the substrate surface.

Once the deposition process is completed, the substrate surface is generally cleaned in a post deposition cleaning process that includes applying a post deposition cleaning solution to the substrate. The post deposition cleaning process may be conducted at either the upper or lower processing position, depending upon the compatibility of the process chemistries. The post deposition cleaning solution generally includes a basic solution having about the same pH as the plating solution. The substrate is rotated during the cleaning process to urge the cleaning solution off of the substrate surface. Once the cleaning process is completed, the substrate surface may be rinsed, with deionized water, for example, and spun dry to remove any residual chemicals from the substrate surface. Alternatively, the substrate may be vapor dried via application of a solvent with a high vapor pressure, such as acetone, alcohols, etc.

In the exemplary processing system 100 of the invention, processing cell locations 102 and 112 may be configured to conduct an electroless preclean process, an electroless activation process, and an electroless post activation cleaning process, while processing cell locations 104, 110 may be configured as electroless deposition cells and electroless post deposition cleaning cells. In this configuration, reclamation of the chemistries from the respective processes is possible, as the respective activation and deposition chemistries are separated in the respective processing locations. Another advantage of this configuration is that the substrate is transferred from an activation solution to an electroless deposition solution in an inert environment, as the processing space for the fluid processing cell locations 102, 104, 110, 112 is within the enclosed processing environment 302. Further, the processing enclosure is flooded with an inert gas during loading and processing, and as such, the interior of the enclosed processing environment 302 has a substantially reduced percentage of oxygen, for example, less than about 100 ppm of oxygen, or more particularly, less than about 50 ppm of oxygen, or further still, less than about 10 ppm of oxygen. The combination of the substantially reduced oxygen content along with the close proximity and fast transfer times between the activation and plating cells (generally less than about 10 seconds) operates to prevent oxidation of the substrate surface between the activation and deposition steps, which has been a significant challenge for conventional electroless systems.

Throughout the fluid processing steps of the invention, the substrate position may be varied. More particularly, the vertical position of the substrate with respect to the fluid diffusion member 405 may be varied. The distance from the diffusion member 405 may be increased to lower the temperature of the substrate, for example, during processing if desired. Similarly, the proximity of the substrate to the diffusion member 405 may be decreased to increase the temperature of the substrate during processing.

Another advantage of embodiments of the invention is that the processing system 100 may be used with compatible or incompatible chemistries. For example, in a processing sequence that utilizes incompatible chemistries, e.g., acidic activation solutions and basic plating solutions, the acidic solutions will generally be exclusively used in one cell or station, while the basic solutions are exclusively used in another cell. The cells may be adjacently positioned and substrates may be transferred between the respective cells by one of the shuttles 305. The substrates are generally cleaned in each cell prior to being transferred to the adjacent cell, which prevents chemistry from one cell from contaminating another cell. Additionally, the multiple processing locations within each processing station or cell, e.g., the positioning of catch rings 418, 419 allows for the use of incompatible chemistries in a single cell or station, as the respective chemistries may be collected by different catch rings 418, 419 and kept separate from each other.

Embodiments of the invention may also be configured as single use-type chemistry cells, i.e., a single dose of the process chemistry may be used for a single substrate and then discarded without solution reclamation, i.e., without being used to process additional substrates. For example, processing system 100 may utilize common cells to activate, clean, and/or post process a substrate, while using other cells to conduct an electroless deposition and/or post-deposition cleaning process. Since each of these processes may utilize a different chemistry, the cell is generally configured to supply each of the required chemistries to the substrate when needed and drain the used chemistry therefrom once the process is completed. However, the cells are generally not configured to recapture the chemistries, as substantial contamination issues are presented by recapturing different chemistries from the single cell.

Additional processing cells that may be used in embodiments of the present invention may be found in commonly assigned U.S. Pat. No. 6,258,223, entitled "In-Situ Electroless Copper Seed Layer Enhancement in an Electroplating System", issued on Jul. 10, 2001, and commonly assigned U.S. patent application Ser. No. 10/036,321, now U.S. Pat. No. 6,824,612, entitled "Electroless Plating System", filed on Dec. 26, 2001, both of which are hereby incorporated by reference in their entireties to the extent not inconsistent with the present invention.

While the foregoing is directed to embodiments of the present invention, other and further embodiments of the invention may be devised without departing from the basic scope thereof, and the scope thereof is determined by the claims that follow.

The invention claimed is:

1. An electroless deposition system, comprising:
   a processing mainframe;
   at least one substrate cleaning station positioned on the mainframe;
   an electroless deposition station positioned on the mainframe, wherein the electroless deposition station comprises:
      an environmentally controlled processing enclosure;
      a first fluid processing station positioned in the processing enclosure;
      a second fluid processing station positioned in the enclosure; and
      a substrate transfer shuttle positioned in the enclosure to transfer substrates between the first and second fluid processing stations; and
   a substrate transfer robot positioned on the mainframe and configured to access an interior of the processing enclosure,
   wherein at least one of the first and second fluid processing stations comprises:
      a rotatable substrate support assembly configured to support a substrate for processing; and
      a plurality of fluid catch rings inwardly and upwardly extending from an interior of the processing stations toward a perimeter of the substrate positioned on the substrate support assembly, wherein each of the plurality of fluid catch rings is configured to collect fluid from the substrate as the substrate is positioned in a corresponding elevation.

2. The deposition system of claim 1, wherein the rotatable substrate support assembly is configured to support a substrate for processing in a face up orientation.

3. The deposition system of claim 2, wherein the rotatable substrate support assembly comprises:
   a vertical lift assembly; and
   a plurality of substrate engaging fingers positioned in communication with the vertical lift assembly.

4. The deposition system of claim 3, wherein the plurality of substrate engaging fingers and the vertical lift assembly are configured to cooperatively position the substrate in parallel relationship with a fluid diffusion member positioned in at least one of the first and second fluid processing stations.

5. The deposition system of claim 2, wherein at least one of the first and second fluid processing stations further comprise:
a fluid diffusion member;
a base plate sealably engaging a perimeter of a backside of the fluid diffusion member and forming a fluid volume between the base plate and the backside of fluid diffusion member; and
a fluid supply conduit in fluid communication with the fluid volume.

6. The deposition system of claim 5, wherein the fluid supply conduit is in fluid communication with a temperature controlled fluid source.

7. The deposition system of claim 5, wherein the fluid diffusion member comprises a porous ceramic disk.

8. The deposition system of claim 5, wherein the fluid diffusion member comprises a disk shaped member having a plurality of holes formed therethrough.

9. The deposition system of claim 8, wherein the plurality of holes have a diameter of between about 0.7 mm and about 3 mm.

10. The fluid deposition system of claim 1, wherein the first and second fluid processing stations each comprise a movable fluid dispensing arm in fluid communication with a source of temperature controlled processing fluid.

11. The fluid deposition system of claim 1, wherein the environmentally controlled processing enclosure comprises a first processing volume positioned above the first fluid processing station and a second processing volume positioned above the second fluid processing station, the first processing volume being at least partially separated from the second processing volume by a central wall.

12. The deposition system of claim 11, wherein a head space volume of the first and second processing volumes is each between about 1500 in$^3$ and 5000 in$^3$.

13. The deposition system of claim 11, wherein each of the first and second processing volumes has an environmental control assembly in communication with the processing volumes.

14. The deposition system of claim 13, wherein the environmental control assembly comprises at least one of a processing gas supply, a heater, and a humidifier.

15. The deposition system of claim 14, further comprising an exhaust port positioned in each of the first and second fluid processing stations.

16. The deposition system of claim 15, wherein the processing gas supply and the exhaust port are cooperatively configured to maintain an oxygen content in the first and second processing volumes of less than about 100 ppm during a processing step.

17. A fluid deposition system for semiconductor processing, comprising:
a processing enclosure defining an environmentally controlled processing volume;
a first fluid processing cell positioned in the controlled processing volume;
a second fluid processing cell positioned in the controlled processing volume; and
a substrate shuttle positioned in the controlled processing volume and being configured to pivotally transfer a substrate between the first and second fluid processing cells,
wherein the first and second fluid processing cells each comprise:
a fluid permeable diffusion member, wherein the fluid diffusion member comprises a disk shaped member having a plurality of radially spaced fluid dispensing holes formed therethrough, and the fluid dispensing holes are in fluid communication with a temperature controlled fluid source;
a substrate support assembly configured to rotatably support a substrate in a face up configuration and in parallel relationship with the fluid diffusion member for processing; and
a fluid dispensing arm movably positioned above the substrate support assembly to dispense a processing liquid onto the substrate positioned on the substrate support assembly.

18. The deposition system of claim 17, further comprising a controlled processing gas supply and a processing gas evacuation port both in fluid communication with the controlled processing volume, the processing gas supply and the processing gas evacuation port being cooperatively configured to generate less than about 100 ppm of oxygen in the processing volume.

19. The deposition system of claim 17, further comprising a central wall positioned to separate the controlled processing volume into a first processing volume positioned over the first fluid processing cell and a second processing volume positioned over the second fluid processing cell.

20. The deposition system of claim 19, wherein at least one of the first and second processing volumes has a head space volume of between about 1000 in$^3$ and 5000 in$^3$.

21. The deposition system of claim 19, wherein a vertical distance from the substrate to a lower surface of the top of the first and second processing volumes is between about 12 inches and about 36 inches.

22. The deposition system of claim 17, wherein the fluid dispensing holes are in fluid communication with a temperature controlled liquid source.

23. The deposition system of claim 17, wherein the fluid diffusion member comprises a fluidly permeable porous ceramic disk member.

24. The deposition system of claim 17, wherein the substrate support assembly comprises a plurality of vertically actuatable substrate support fingers.

25. The deposition system of claim 17, wherein the fluid dispensing arm is in fluid communication with a temperature controlled processing fluid source.

* * * * *

UNITED STATES PATENT AND TRADEMARK OFFICE
CERTIFICATE OF CORRECTION

| | |
|---|---|
| PATENT NO. | : 7,323,058 B2 |
| APPLICATION NO. | : 10/996342 |
| DATED | : January 29, 2008 |
| INVENTOR(S) | : Lubomirsky et al. |

Page 1 of 1

It is certified that error appears in the above-identified patent and that said Letters Patent is hereby corrected as shown below:

Column 9, Line 15, please delete "eleotroless" and insert --electroless--.

Signed and Sealed this

Fifteenth Day of July, 2008

JON W. DUDAS
*Director of the United States Patent and Trademark Office*